United States Patent
Chien

(10) Patent No.: US 10,437,274 B2
(45) Date of Patent: Oct. 8, 2019

(54) REFERENCE VOLTAGE GENERATOR

(71) Applicant: RichWave Technology Corp., Taipei (TW)

(72) Inventor: Hwey-Ching Chien, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/157,077

(22) Filed: Oct. 10, 2018

(65) Prior Publication Data

US 2019/0204863 A1   Jul. 4, 2019

(30) Foreign Application Priority Data

Jan. 3, 2018   (TW) .............................. 107100166 A

(51) Int. Cl.
*G05F 3/20* (2006.01)
*G05F 3/22* (2006.01)
*H03F 3/45* (2006.01)

(52) U.S. Cl.
CPC .............. *G05F 3/222* (2013.01); *G05F 3/20* (2013.01); *H03F 3/4508* (2013.01); *H03F 2203/45022* (2013.01); *H03F 2203/45318* (2013.01); *H03F 2203/45352* (2013.01)

(58) Field of Classification Search
CPC ..... G05F 3/08; G05F 3/20; G05F 3/22; G05F 3/222; G05F 3/227; G05F 3/24; G05F 3/242; G05F 3/247; H03F 3/4508; H03F 2203/45352; H03F 2203/45318; H03F 2203/45022

USPC ......................................... 323/313, 314, 315
See application file for complete search history.

(56) References Cited

U.S. PATENT DOCUMENTS

| 3,893,018 | A | * | 7/1975 | Marley | .................... | G05F 3/30 |
| | | | | | | 323/313 |
| 5,530,340 | A | * | 6/1996 | Hayakawa | .............. | G05F 3/222 |
| | | | | | | 323/314 |
| 5,926,062 | A | * | 7/1999 | Kuroda | ................... | G05F 3/265 |
| | | | | | | 323/315 |
| 6,037,833 | A | | 3/2000 | Ang | | |

(Continued)

FOREIGN PATENT DOCUMENTS

| CN | 101739050 A | 6/2010 |
| CN | 103488227 B | 2/2015 |

(Continued)

*Primary Examiner* — Alex Torres-Rivera
(74) *Attorney, Agent, or Firm* — Winston Hu

(57) ABSTRACT

A reference voltage generator includes a voltage generation circuit, an amplifier, a diode unit and a transistor. The voltage generation circuit includes an output terminal for outputting a reference voltage, a first terminal having an operational voltage, and a second terminal. The amplifier includes an input terminal coupled to the first terminal of the voltage generation circuit, an output terminal, a first terminal coupled to a first voltage terminal, and a second terminal. The diode unit includes a first terminal coupled to the second terminal of the amplifier, and a second terminal coupled to the second terminal of the voltage generation circuit and a second voltage terminal. The transistor includes a first terminal coupled to the first terminal of the amplifier, a second terminal coupled to the output terminal of the voltage generation circuit, and a control terminal coupled to the output terminal of the amplifier.

17 Claims, 5 Drawing Sheets

(56) References Cited

U.S. PATENT DOCUMENTS

| | | | |
|---|---|---|---|
| 6,201,381 B1* | 3/2001 | Yasuda | G05F 3/262 |
| | | | 323/315 |
| 6,998,902 B2 | 2/2006 | Sugimura | |
| 7,920,015 B2* | 4/2011 | Chellappa | G05F 3/30 |
| | | | 323/314 |
| 9,564,805 B2 | 2/2017 | Sano | |
| 2006/0001412 A1* | 1/2006 | Fernald | G05F 3/262 |
| | | | 323/313 |
| 2011/0193544 A1* | 8/2011 | Iacob | G05F 3/242 |
| | | | 323/315 |
| 2013/0293215 A1* | 11/2013 | Lym | G05F 3/30 |
| | | | 323/313 |
| 2014/0375371 A1* | 12/2014 | Park | G05F 3/242 |
| | | | 327/332 |
| 2016/0091917 A1* | 3/2016 | Imura | G05F 3/18 |
| | | | 323/312 |

FOREIGN PATENT DOCUMENTS

| | | |
|---|---|---|
| TW | 201331738 A1 | 8/2013 |
| TW | 201413415 A | 4/2014 |

* cited by examiner

REFERENCE VOLTAGE GENERATOR

CROSS REFERENCE TO RELATED APPLICATION

This application claims priority to Taiwan Patent Application No. 107100166, filed Jan. 3, 2018, and incorporated herein by reference in its entirety.

TECHNICAL FIELD

The present invention relates to a reference voltage generator, and more particularly, a reference voltage generator for providing a substantially constant reference voltage being substantially unaffected by temperature.

BACKGROUND

In the field of electrical circuit application, a reference voltage is usually provided by using a reference voltage generator such as a bandgap voltage generator. However, in a conventional reference voltage generator, a control voltage may be as low as 1.2 volt. Then, an operational amplifier may be used to amplify the 1.2 volts voltage to generate a 3.3 volts reference voltage. In this sort of circuit structure, an operational amplifier is necessary, and a compensation capacitor of the operational amplifier will make it difficult to reduce circuit area. In addition, it is also difficult to improve the power supply rejection ratio (PSRR) when using a conventional reference voltage generator. In other words, the provided reference voltage is easily affected by noise of a power supply. When manufacturing a conventional reference voltage generator, limitation of process is a problem. For example, it is hard to use a Gallium arsenide (GaAs) Heterojunction Bipolar Transistor (HBT) process. For example, in a conventional reference voltage generator, a current source including P-type metal oxide semiconductor field-effect transistor (MOSFET) is often required, and a circuit including N-type MOSFET is also needed. Hence, a GaAs process is hard to be used in manufacture.

SUMMARY

An embodiment of the present invention provides a reference voltage generator. The reference voltage generator includes a first resistor, a first transistor, a second transistor, a third transistor, a fourth transistor, a second resistor, a third resistor, a fourth resistor, a fifth transistor, a diode unit and a sixth transistor. The first resistor includes a first terminal and a second terminal. The first transistor includes a first terminal, a second terminal coupled to the second terminal of the first resistor, and a control terminal coupled to an operation node. The second transistor includes a first terminal, a second terminal coupled to the first terminal of the first resistor, and a control terminal coupled to the operation node. The third transistor includes a first terminal, a second terminal coupled to the first terminal of the first transistor, and a control terminal coupled to the first terminal of the third transistor. The fourth transistor includes a first terminal, a second terminal coupled to the first terminal of the second transistor, and a control terminal coupled to the control terminal of the third transistor. The second resistor includes a first terminal coupled to an output terminal for outputting a reference voltage, and a second terminal coupled to the first terminal of the fourth transistor. The third resistor includes a first terminal coupled to the first terminal of the second resistor, and a second terminal coupled to the first terminal of the third transistor. The fourth resistor includes a first terminal and a second terminal. The fifth transistor includes a first terminal coupled to the second terminal of the fourth resistor, a second terminal, and a control terminal coupled to the first terminal of the fourth transistor. The diode unit includes a first terminal coupled to the second terminal of the fifth transistor, and a second terminal coupled to the second terminal of the first resistor. The sixth transistor includes a first terminal coupled to the first terminal of the fourth resistor, a second terminal coupled to the first terminal of the second resistor, and a control terminal coupled to the second terminal of the fourth resistor. The operation node is coupled to the first terminal of the first transistor or the first terminal of the second transistor.

Another embodiment of the present invention provides a reference voltage generator. The reference voltage generator includes a constant voltage generation circuit, an amplifier, a diode unit and a transistor. The constant voltage generation circuit includes an output terminal for outputting a reference voltage, a first terminal having a first operational voltage, and a second terminal. The amplifier includes an input terminal coupled to the first terminal of the constant voltage generation circuit, an output terminal, a first terminal coupled to a first voltage terminal, and a second terminal. The diode unit includes a first terminal coupled to the second terminal of the amplifier, and a second terminal coupled to the second terminal of the constant voltage generation circuit and a second voltage terminal. The transistor includes a first terminal coupled to the first terminal of the amplifier, a second terminal coupled to the output terminal of the constant voltage generation circuit, and a control terminal coupled to the output terminal of the amplifier.

DETAILED DESCRIPTION

Figure 1:
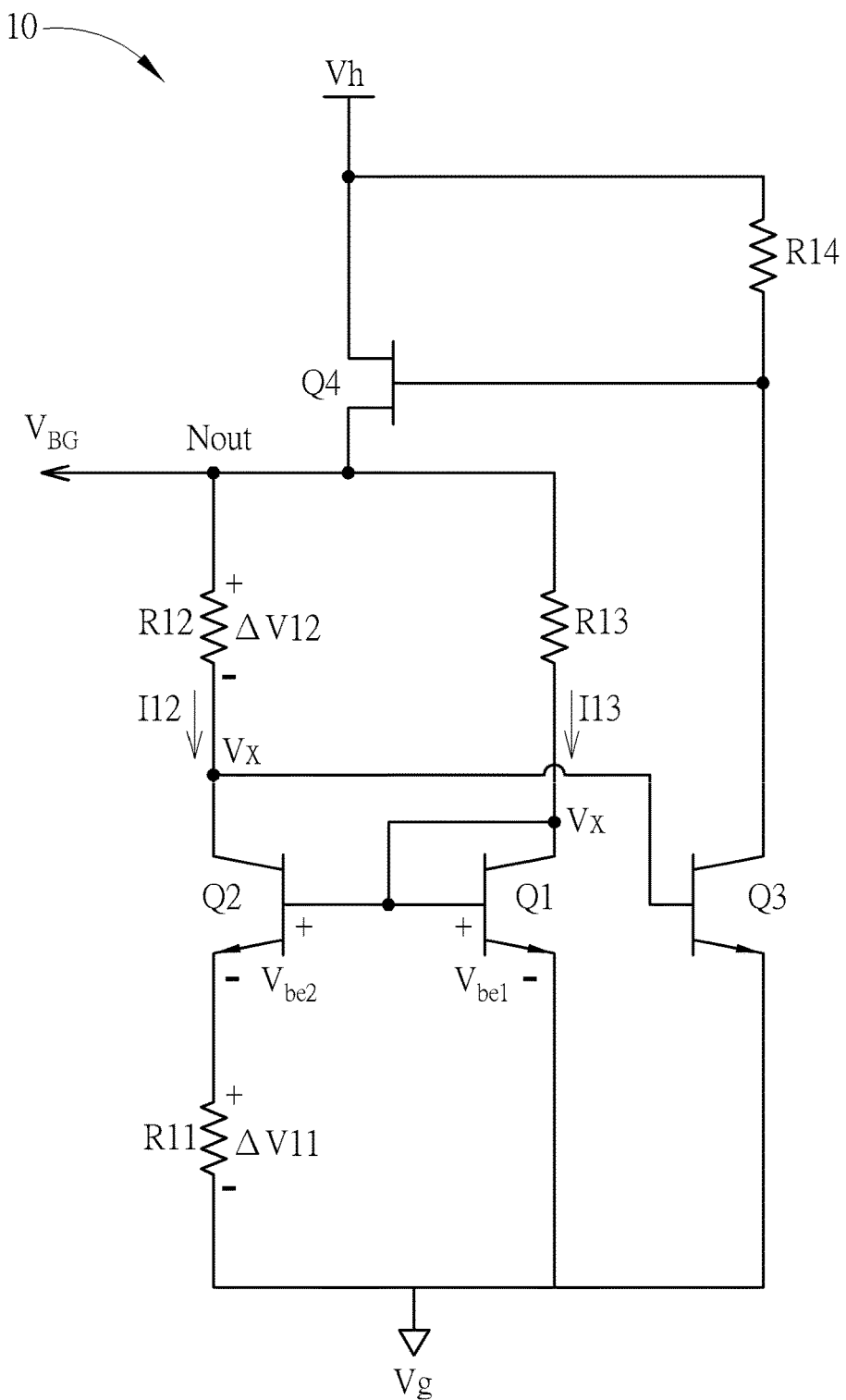
FIG. 1 illustrates a reference voltage generator according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a reference voltage generator 10 according to an embodiment. The reference voltage generator 10 may include transistors Q1 to Q4 and resistors R11 to R14. The transistor Q1 may include a first terminal, a control terminal and a second terminal, and the control terminal is coupled to the first terminal. The transistor Q2 may include a first terminal, a control terminal and a second terminal, and the control terminal is coupled to the control terminal of the transistor Q1. The resistor R11 may include a first terminal and a second terminal, the first terminal is coupled to the second terminal of the transistor Q2, and the second terminal is coupled to the second terminal of the transistor Q1 and a voltage terminal Vg. The resistor R12 may include a first terminal and a second terminal where the first terminal is coupled to an output terminal Nout for outputting a reference voltage $V_{BG}$, and the second terminal is coupled to the first terminal of the transistor Q2. The reference voltage $V_{BG}$ may be a bandgap voltage. The resistor R13 may include a first terminal and a second terminal where the first terminal is coupled to the output terminal Nout and the second terminal is coupled to the first terminal of the transistor Q1. The transistor Q4 may include a first terminal, a control terminal and a second terminal where the first terminal is coupled to a voltage terminal Vh, and the second terminal is coupled to the first terminal of the resistor R12 and the first terminal of the resistor R13. The resistor R14 may include a first terminal and a second terminal where the first terminal is coupled to the voltage terminal Vh, and the second terminal is coupled to the control terminal of the transistor Q4. The transistor Q3 may include a first terminal, a control terminal and a second terminal where the first terminal is coupled to the second terminal of the resistor R14, the control terminal is coupled to the first terminal of the transistor Q2, and the second terminal is coupled to the second terminal of the transistor Q1. The resistors R12 and R13 may have identical resistance substantially. The first terminal of the transistor Q2 (i.e. the second terminal of the resistor R12) and the first terminal of the transistor Q1 (i.e. the second terminal of the resistor R13) may have an identical voltage Vx. There may be a voltage $V_{be1}$ across the control terminal and the second terminal of the transistor Q1. There may be a voltage $V_{be2}$ across the control terminal and the second terminal of the transistor Q2. There may be a voltage $\Delta V11$ across the resistor R11. There may be a voltage $\Delta V12$ across the resistor R12. Currents flowing through the resistors R12 and R13 may be I12 and I13 respectively. The current I12 may be identical to the current I13 substantially, and it can be expressed as I12=I13=I. The saturation currents of the transistors Q1 and Q2 may be currents $I_{S1}$ and $I_{S2}$ respectively. The area of the transistor Q2 may be adjusted to be four times the area of the transistor Q1, so the equation $I_{S2}=4\times I_{S1}$ may be derived. In this case, the multiplier four is an example. According to another embodiment, the area of the transistor Q2 may be adjusted to be n times the area of the transistor Q1. The following embodiments may be used to adjust the area of the transistor Q2 to be n times the area of the transistor Q1. For example, on a circuit layout, the transistor Q1 may be copied n times to form the transistor Q2. In another example, the number of the transistor Q2 may be n times the number of the transistor Q1, where n is a positive integer.

According to the above description and FIG. 1, the following derivation may be obtained.

$$V_{be1} = V_T \ln(I/I_{S1});$$

$$V_{be2} = V_T \ln(I/I_{S2});$$

$$I_{S2} = 4 \times I_{S1};$$

$$\Delta V11 = V_{be1} - V_{be2}$$
$$= V_T[\ln(I/I_{S1}) - \ln(I/I_{S2})]$$
$$= V_T \ln(I_{S2}/I_{S1})$$
$$= V_T \ln 4$$
$$= (kT/q)\ln 4;$$

$$V_{BG} = \Delta V12 + V_{be1} = (R12/R11) \times \Delta V11 + V_{be1};$$

In the above equations, $V_T$ may be a thermal voltage, k may be the Boltzmann constant, T may be an absolute temperature, and q may be elementary electric charge. Hence, it may be derived that $\Delta V11$ is a positive temperature coefficient. Since the cross voltage $V_{be1}$ is a negative temperature coefficient, the reference voltage $V_{BG}$ may be kept without being affected by temperature substantially by adjusting a ration of R12/R11. For example, when using a GaAs process, the reference voltage $V_{BG}$ in FIG. 1 may be 1.6 volts approximately.

Figure 2:
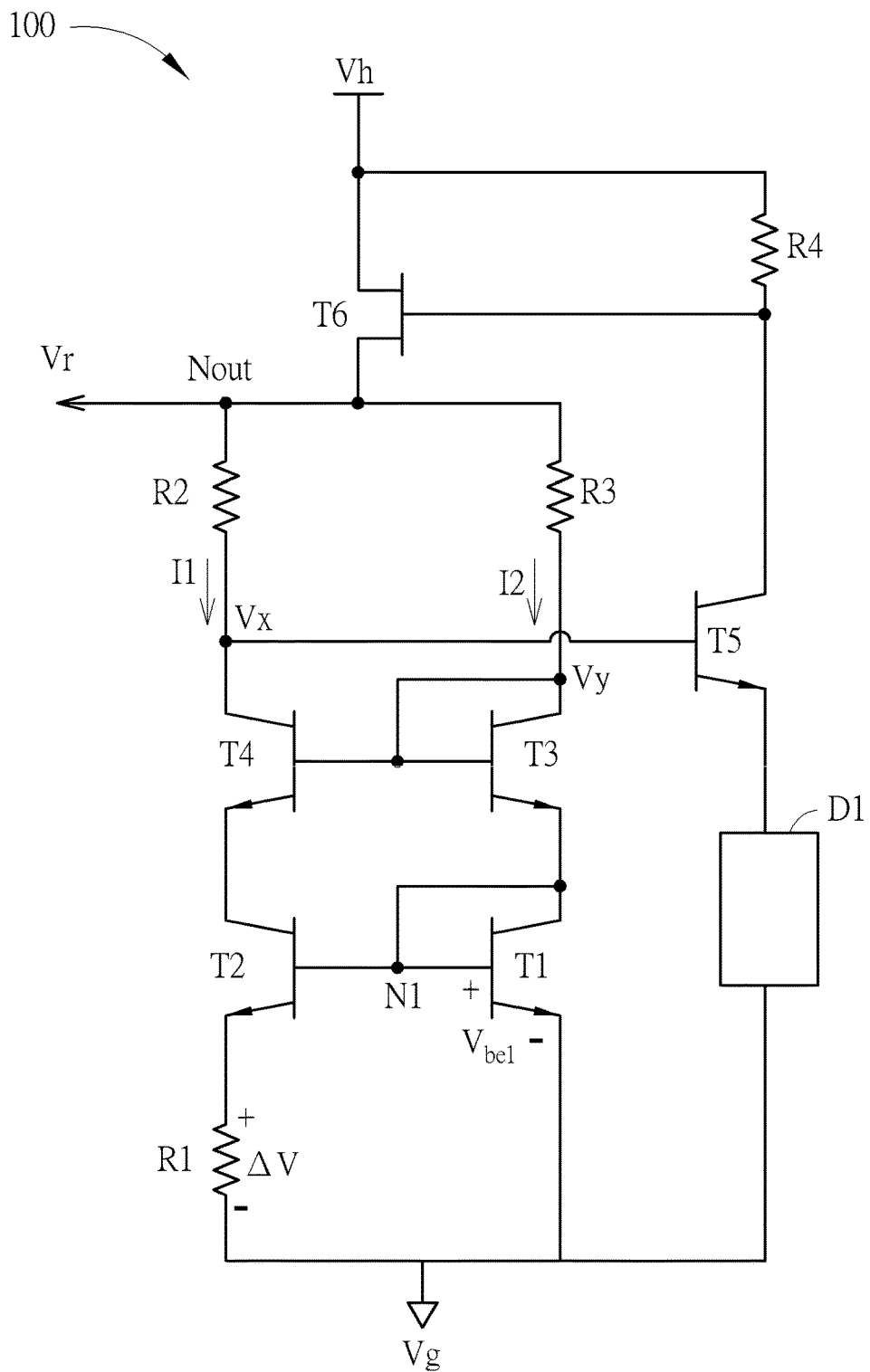
FIG. 2 illustrates a reference voltage generator according to another embodiment.

FIG. 2 illustrates a reference voltage generator 100 according to another embodiment. The reference voltage generator 100 may include resistors R1 to R4, transistors T1 to T6 and a diode unit D1. The transistors T1 and T2 in FIG. 2 may be similar to the transistors Q1 and Q2 in FIG. 1, but the transistors T1 and T2 may be coupled to the transistors T3 and T4 respectively to form stack structures. As shown in FIG. 2, the resistor R1 may include a first terminal and a second terminal. The transistor T1 may include a first terminal, a second terminal and a control terminal where the second terminal is coupled to the second terminal of the resistor R1, and the control terminal is coupled to an operation node N1. The transistor T2 may include a first terminal, a second terminal and a control terminal where the second terminal is coupled to the first terminal of the resistor R1, and the control terminal is coupled to the operation node N1. The transistor T3 may include a first terminal, a second terminal and a control terminal where the first terminal has an operational voltage Vy, the second terminal is coupled to the first terminal of the transistor T1, and a control terminal is coupled to the first terminal of the transistor T3. The transistor T4 may include a first terminal, a second terminal and a control terminal where the first terminal has an operational voltage Vx, the second terminal is coupled to the first terminal of the transistor T2, and the control terminal is coupled to the control terminal of the transistor T3. The resistor R2 may include a first terminal and a second terminal where the first terminal is coupled to an output terminal Nout for outputting a reference voltage Vr, and the second terminal is coupled to the first terminal of the transistor T4. The resistor R3 may include a first terminal and a second terminal where the first terminal is coupled to the first terminal of the resistor R2, and a second terminal is coupled to the first terminal of the transistor T3. The resistor R4 may include a first terminal and a second terminal. The transistor T5 may include a first terminal, a second terminal and a control terminal where the first terminal is coupled to the second terminal of the resistor R4, and the control terminal is coupled to the first terminal of the transistor T4. The diode unit D1 may include a first terminal and a second terminal where the first terminal is coupled to the second terminal of the transistor T5, and the second terminal is coupled to the second terminal of the resistor R1. The transistor T6 may include a first terminal, a second terminal and a control terminal where the first terminal is coupled to the first terminal of the resistor R4, the second terminal is coupled to the first terminal of the resistor R2, and the control terminal is coupled to the second terminal of the resistor R4. As shown in FIG. 2, the first terminal of the resistor R4 may be coupled to a voltage terminal Vh, and the second terminal of the resistor R1 may be coupled to a voltage terminal Vg. According to an embodiment, a voltage of the voltage terminal Vh may be higher than a voltage of the voltage terminal Vg. For example, the voltage terminal Vh may be a supply voltage terminal, and the voltage terminal Vg may be a low voltage terminal or a ground terminal. When being operated, the control terminal of the transistor T6 may have a higher voltage than the second terminal of the transistor T6. A unidirectional feedback from the control terminal of the transistor T6 to the second terminal of the transistor T6 may make the operational voltages Vx and Vy be unaffected by changes of the reference voltage Vr. The transistor T6 may hence have an effect of isolation.

Figure 3:
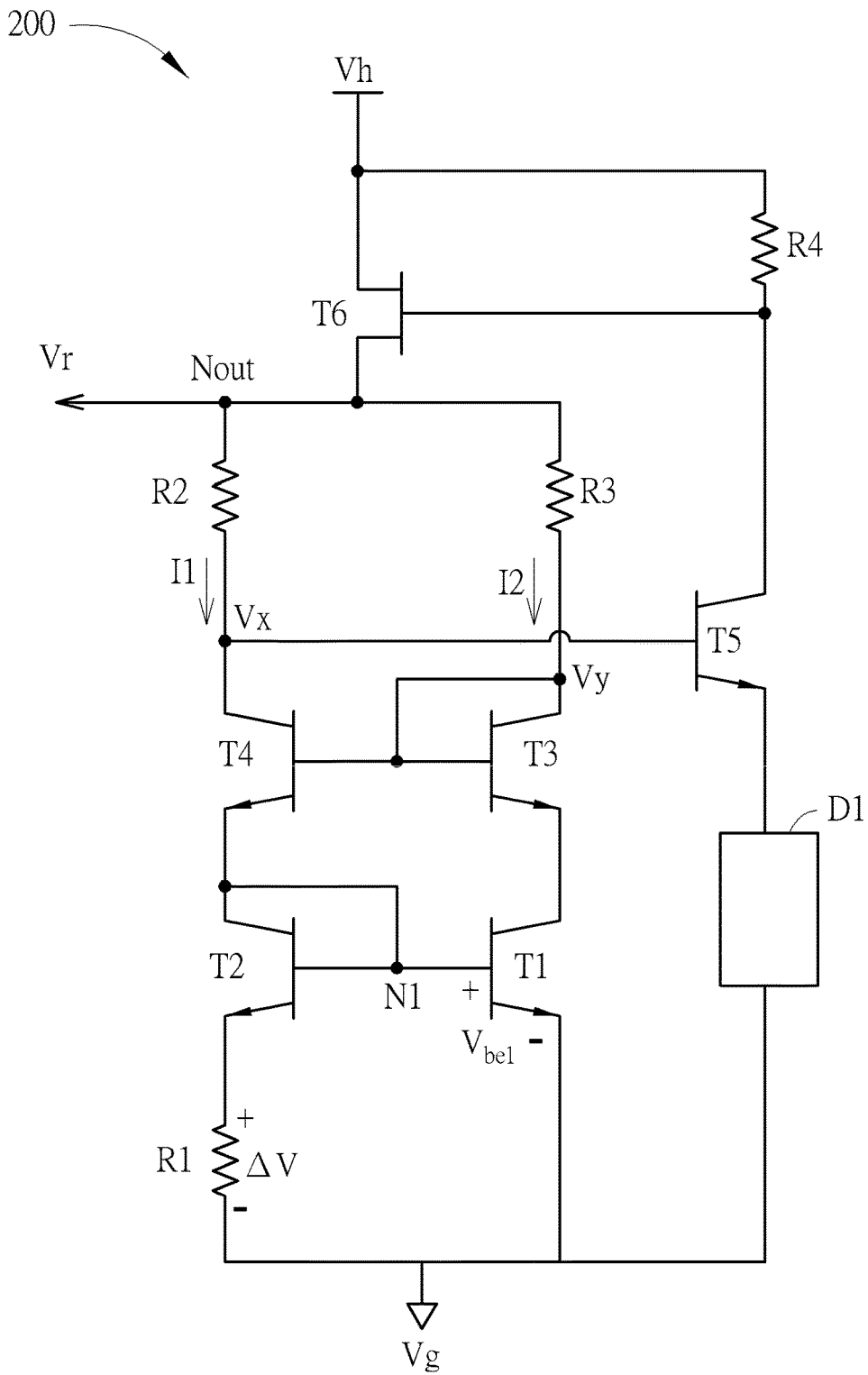
FIG. 3 illustrates a reference voltage generator according to another embodiment.

According to an embodiment, the operation node N1 may be coupled to the first terminal of the transistor T1 or the first terminal of the transistor T2. In FIG. 2, the operation node N1 is coupled to the first terminal of the transistor T1. FIG. 3 illustrates a reference voltage generator 200 according to another embodiment. The reference voltage generator 200 may be similar to the reference voltage generator 100, but in the reference voltage generator 200, the operation node N1 may be coupled to the first terminal of the transistor N2.

According to embodiments, at least one of the transistors T1 to T5 may be a bipolar junction transistor (BJT), and the BJT may be an NPN-type transistor. The transistor T6 may be a field effect transistor (FET) or a BJT. When a transistor is a BJT, the first terminal may be a collector terminal, the second terminal may be an emitter terminal, and the control terminal may be a base terminal. When a transistor is a FET, the first terminal may be a drain terminal, the second terminal may be a source terminal, and the control terminal may be a gate terminal. The reference voltage generators 100 and 200 may be manufactured using a Bipolar Field Effect Transistor (BIFET) process or a bipolar process. According to an embodiment, the reference voltage generators 100 and 200 may be formed using Heterojunction Bipolar Transistor (HBT) process such as a GaAs HBT process. According to embodiments, the used HBT process may be an III-V process (e.g. a GaAs process) or an IV-IV process (e.g. a SiGe process). According to embodiments, the reference voltage generators 100 and 200 may be manufactured using a high-electron-mobility transistor (HEMT) process (e.g. a depletion-mode pseudomorphic HEMT (D-mode pHEMT)) so as to increase voltage headroom of the circuit.

According to an embodiment, the first terminal of the transistor T3 and the first terminal of the transistor T4 may have a substantially identical voltage. In other words, the operational voltages Vx and Vy may be identical substantially, that is, Vx=Vy. In addition, the current I1 flowing through the resistor R2 may be adjusted to be substantially identical to the current I2 flowing through the resistor R3, so the current I1 may be substantially identical to the current I2. A negative feedback path formed by the transistor T5, the resistor R4 and the diode unit D1 may reduce the influence of the voltage terminal Vh on the reference voltage Vr, so the PSRR may be improved.

In FIG. 2 and FIG. 3, the resistors R2 and R3 may have a substantially identical resistance. Comparing FIG. 1 with FIG. 2 and FIG. 3, the transistors Q1, Q2, Q3 and Q4 shown in FIG. 1 may be corresponding to the transistors T1, T2, T5 and T6 shown in FIG. 2 and FIG. 3. The resistance of one of the resistors R2 and R3 may be twice the resistance of one of the resistors R12 and R13. In other words, it may expressed as R12=R13=R, and R2=R3=R×2. In FIG. 2 and FIG. 3, The area of the transistor T2 may be substantially four times the area of the transistor T1.

According to FIG. 2 and FIG. 3, the following calculation may be derived. A parameter K may be obtained by dividing the resistance of the resistor R2 by the resistance of the resistor R1, and it can be expressed as K=R2/R1. There may be a voltage $\Delta V$ across the two terminals of the resistor R1. There may be a voltage $\Delta V_{bel}$ across the control terminal and the second terminal of the transistor T1. The voltage $\Delta V$ in FIG. 2 may be corresponding to the voltage $\Delta V11$ in FIG. 1, so the voltage $\Delta V$ may be a positive temperature coefficient increasing when the temperature is raised. The voltage $V_{bel}$ of FIG. 2 may be corresponding to the voltage $V_{bel}$ of FIG. 1, so the voltage $V_{bel}$ may be a negative temperature coefficient decreasing when the temperature is raised. By adjusting the parameter K, a sum of the voltage $V_{bel}$ and a product of the parameter K and the voltage $\Delta V$ (that can be expressed as $K \times \Delta V + V_{bel}$) may be substantially unaffected by temperature. Furthermore, the sum may be proportional to the reference voltage Vr. Because the reference voltage generator 100 of FIG. 2 has two more additional transistors T3 and T4 than the reference voltage generator 10 of FIG. 1, the reference voltage generator 100 may have a stack structure, and the reference voltage $V_{BG}$ of FIG. 1 may be level shifted to generate the reference voltage Vr of FIG. 2. According to an embodiment, the reference voltage Vr of FIG. 2 may be substantially twice the reference voltage $V_{BG}$ of FIG. 1, and it may be expressed as Vr≈m $V_{BG}$×2. For example, when a GaAs process is used, the reference voltage $V_{BG}$ of FIG. 1 may be 1.6 volts approximately, so the reference voltage Vr outputted from the output terminal Nout of FIG. 2 may substantially be 3.3 volts approximately. Because 3.3 volts may be a commonly used reference voltage, the voltage may be provided for related applications. Likewise, in FIG. 3, the outputted reference voltage Vr may also be 3.3 volts approximately and provided for related applications.

Figure 4:
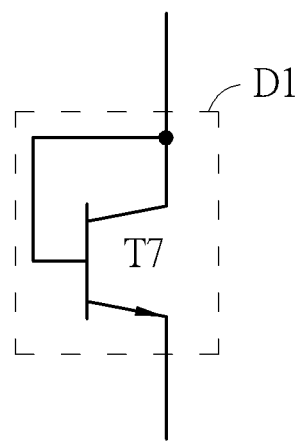
FIG. 4 illustrates the structure of the diode unit in FIG. 2 and FIG. 3 according to an embodiment.

FIG. 4 illustrates the structure of the diode unit D1 in FIG. 2 and FIG. 3 according to an embodiment. As shown in FIG. 4, the diode unit D1 may include a transistor T7. The transistor T7 may include a first terminal, a second terminal and a control terminal where the first terminal is coupled to the first terminal of the diode unit D1, the second terminal is coupled to the second terminal of the diode unit D1, and the control terminal is coupled to the first terminal of the transistor T7. According to embodiments, the transistor T7 may be a FET or a BJT, and the BJT may be an NPN-type transistor. When the transistor T7 is a BJT, the first terminal may be a collector terminal, the second terminal may be an emitter terminal, and the control terminal may be a base terminal. When the transistor T7 is a FET, the first terminal may be a drain terminal, the second terminal may be a source terminal, and the control terminal may be a gate terminal.

Figure 5:
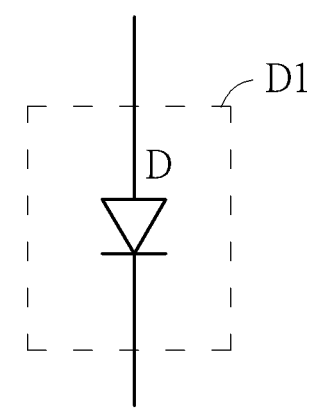
FIG. 5 illustrates the structure of the diode unit in FIG. 2 and FIG. 3 according to another embodiment.

FIG. 5 illustrates the structure of the diode unit D1 in FIG. 2 and FIG. 3 according to another embodiment. The diode unit D1 may include a diode D. The diode D may include a first terminal and a second terminal where the first terminal is coupled to the first terminal of the diode unit D1, and the second terminal is coupled to the second terminal of the diode unit D1. For example, the first terminal of the diode D may be an anode terminal, and the second terminal may be a cathode terminal.

Figure 6:
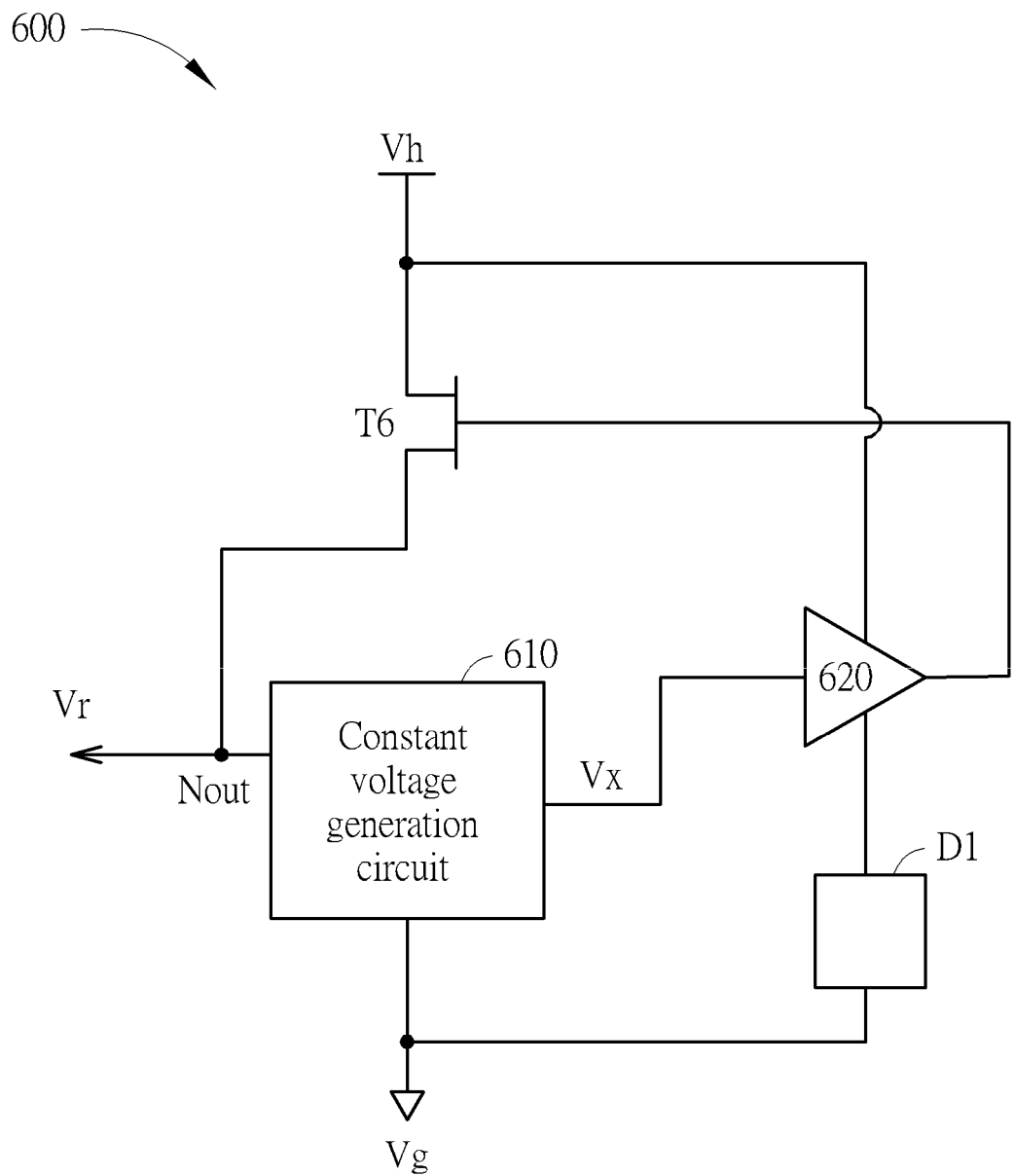
FIG. 6 illustrates a reference voltage generator according to an embodiment.

FIG. 6 illustrates a reference voltage generator 600 according to an embodiment. The reference voltage generator 600 may include a constant voltage generation circuit 610, an amplifier 620, a diode unit D1 and a transistor T6. The constant voltage generation circuit 610 may include an output terminal Nout, a first terminal and a second terminal where the output terminal Nout is used for outputting a reference voltage Vr and the first terminal may have an operational voltage Vx. The amplifier 620 may include an input terminal, an output terminal, a first terminal and a second terminal where the input terminal is coupled to the first terminal of the constant voltage generation circuit 610, and the first terminal is coupled to a voltage terminal Vh. The diode unit D1 may include a first terminal and a second terminal where the first terminal is coupled to the second terminal of the amplifier 620, and the second terminal is coupled to the second terminal of the constant voltage generation circuit 610 and a voltage terminal Vg. The transistor T6 may include a first terminal, a second terminal and a control terminal where the first terminal is coupled to the first terminal of the amplifier 620, the second terminal is coupled to the output terminal Nout of the constant voltage generation circuit 610, and the control terminal is coupled to the output terminal of the amplifier 620.

For example, the constant voltage generation circuit 610 in FIG. 6 may include the transistors T1 to T4 and the resistors R1 to R3 of FIG. 2 and FIG. 3. The amplifier 620 may include the transistor T5 and the resistor R4 as an example. The couplings of the components may be as shown in FIG. 2 or FIG. 3. In the circuits, the first terminal of the resistor R2 of FIG. 2 or FIG. 3 may be coupled to the output terminal of the constant voltage generation circuit 610. The first terminal of the transistor T4 may be coupled to the first terminal of the constant voltage generation circuit 610. The second terminal of the resistor R1 may be coupled to the second terminal of the constant voltage generation circuit 610. In the circuit, the first terminal of the resistor R4 of FIG. 2 or FIG. 3 may be coupled to the first terminal of the amplifier 620. The second terminal of the resistor R4 of FIG. 2 or FIG. 3 may be coupled to the output terminal of the amplifier 620. The second terminal of the transistor T5 may be coupled to the second terminal of the amplifier 620. The control terminal of the transistor T5 may be coupled to the input terminal of the amplifier 620. The diode unit D1 and the transistor T6 of FIG. 6 may be corresponding to the diode unit D1 and the transistor T6 of FIG. 2 and FIG. 3. In addition, other suitable circuit structures are within the scope of embodiments of the application.

In summary, a reference voltage generator provided by an embodiment may have an effect of low dropout voltage without using an operational amplifier, so the circuit area occupied by compensation capacitors may be reduced. Moreover, the PSRR may be improved so as to reduce the influence of the noise of a power supply terminal. An external current source may be unneeded when using the reference voltage generator of an embodiment, so use of different types of transistors is avoided. This may lead to less limitations of the manufacture process. For example, it may be allowed to use a GaAs HBT process. A reference voltage generators provided by an embodiment may have a larger voltage headroom, and an outputted reference voltage may be substantially less sensitive to temperature. For example, a reference voltage may be provided substantially stably under an operating temperature range of −45° C. to 85° C. Hence, it is beneficial for alleviating engineering problems in the field by using a reference voltage generator provided by an embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A reference voltage generator comprising:
a first resistor comprising a first terminal and a second terminal;
a first transistor comprising a first terminal, a second terminal coupled to the second terminal of the first resistor, and a control terminal coupled to an operation node;
a second transistor comprising a first terminal, a second terminal coupled to the first terminal of the first resistor, and a control terminal coupled to the operation node;
a third transistor comprising a first terminal, a second terminal coupled to the first terminal of the first transistor, and a control terminal coupled to the first terminal of the third transistor;
a fourth transistor comprising a first terminal, a second terminal coupled to the first terminal of the second transistor, and a control terminal coupled to the control terminal of the third transistor;
a second resistor comprising a first terminal coupled to an output terminal for outputting a reference voltage, and a second terminal coupled to the first terminal of the fourth transistor;
a third resistor comprising a first terminal coupled to the first terminal of the second resistor, and a second terminal coupled to the first terminal of the third transistor;
a fourth resistor comprising a first terminal and a second terminal;
a fifth transistor comprising a first terminal coupled to the second terminal of the fourth resistor, a second terminal, and a control terminal coupled to the first terminal of the fourth transistor;
a diode unit comprising a first terminal coupled to the second terminal of the fifth transistor, and a second terminal coupled to the second terminal of the first resistor; and
a sixth transistor comprising a first terminal coupled to the first terminal of the fourth resistor, a second terminal coupled to the first terminal of the second resistor, and a control terminal coupled to the second terminal of the fourth resistor;
wherein the operation node is coupled to the first terminal of the first transistor or the first terminal of the second transistor.

2. The reference voltage generator of claim 1, wherein a voltage level at the first terminal of the third transistor is substantially equal to a voltage level at the first terminal of the fourth transistor, and a current flowing through the second resistor is substantially equal to a current flowing through the third resistor.

3. The reference voltage generator of claim 1, wherein a resistance of the second resistor is substantially equal to a resistance of the third resistor.

4. The reference voltage generator of claim 1, wherein a resistance of the second resistor is divided by a resistance of the first resistor to obtain a parameter, a first voltage difference is across the first resistor, a second voltage difference is across the control terminal and the second terminal of the first transistor, a sum is obtained by summing the second voltage difference and a product of the parameter and the first voltage difference, and the sum is substantially unaffected by temperature.

5. The reference voltage generator of claim 1, wherein a resistance of the second resistor is divided by a resistance of the first resistor to obtain a parameter, a first voltage difference is across the first resistor, a second voltage difference is across the control terminal and the second terminal of the first transistor, a sum is obtained by summing the second voltage difference and a product of the parameter and the first voltage difference, and the sum is substantially proportional to the reference voltage.

6. The reference voltage generator of claim 1, wherein the diode unit comprises a seventh transistor, and the seventh transistor comprises a first terminal coupled to the first terminal of the diode unit, a second terminal coupled to the second terminal of the diode unit, and a control terminal coupled to the first terminal of the seventh transistor.

7. The reference voltage generator of claim 6, wherein the seventh transistor is a field effect transistor.

8. The reference voltage generator of claim 6, wherein the seventh transistor is a bipolar junction transistor.

9. The reference voltage generator of claim 8, wherein the bipolar junction transistor is an NPN-type transistor.

10. The reference voltage generator of claim 1, wherein the diode unit comprises a diode, and the diode comprises a first terminal coupled to the first terminal of the diode unit, and a second terminal coupled to the second terminal of the diode unit.

11. The reference voltage generator of claim 1, wherein the reference voltage generator is manufactured using a Bipolar Field Effect Transistor process or a bipolar process.

12. The reference voltage generator of claim 1, wherein the first terminal of the fourth resistor is coupled to a first voltage terminal, the second terminal of the first resistor is coupled to a second voltage terminal, and a voltage at the first voltage terminal is higher than a voltage at the second voltage terminal.

13. The reference voltage generator of claim 1, wherein an area of the second transistor is substantially four times an area of the first transistor.

14. The reference voltage generator of claim 1, wherein at least one of the first transistor, the second transistor, the third transistor, the fourth transistor and the fifth transistor is a bipolar junction transistor.

15. The reference voltage generator of claim 14, wherein the bipolar junction transistor is an NPN-type transistor.

16. The reference voltage generator of claim 1, wherein the sixth transistor is a field-effect transistor.

17. The reference voltage generator of claim 1, wherein the sixth transistor is a bipolar junction transistor.

* * * * *